United States Patent
Tiberi et al.

(10) Patent No.: US 7,898,162 B2
(45) Date of Patent: Mar. 1, 2011

(54) ELECTRON BEAM PUMPED LASER LIGHT SOURCE FOR PROJECTION TELEVISION

(75) Inventors: Michael D. Tiberi, Woodland Hills, CA (US); Vladimir I. Kozlovsky, Troitsk (RU)

(73) Assignee: Principia Lightworks, Inc., Woodland Hills, CA (US)

(*) Notice: Subject to any disclaimer, the term of this patent is extended or adjusted under 35 U.S.C. 154(b) by 489 days.

(21) Appl. No.: 11/936,555

(22) Filed: Nov. 7, 2007

(65) Prior Publication Data
US 2008/0054782 A1    Mar. 6, 2008

Related U.S. Application Data

(62) Division of application No. 11/041,839, filed on Jan. 24, 2005, now Pat. No. 7,309,953.

(51) Int. Cl.
H01J 29/46    (2006.01)
G03B 21/00    (2006.01)

(52) U.S. Cl. .................. 313/474; 353/122; 348/E9.026
(58) Field of Classification Search ................... None
See application file for complete search history.

(56) References Cited

U.S. PATENT DOCUMENTS

| 4,539,687 | A | 9/1985 | Gordon et al. |
| 4,695,332 | A | 9/1987 | Gordon et al. |
| 5,254,502 | A | 10/1993 | Kozlovsky |
| 5,280,360 | A | 1/1994 | Derdyra et al. |
| 5,283,798 | A | 2/1994 | Kozlovsky et al. |
| 5,313,483 | A | 5/1994 | Kozlovsky et al. |
| 5,317,583 | A | 5/1994 | Nasibov et al. |
| 5,339,003 | A | 8/1994 | Kozlovsky et al. |
| 5,374,870 | A | 12/1994 | Akhekyan et al. |
| 5,577,948 | A | 11/1996 | Kordonsky et al. |
| 5,687,185 | A | 11/1997 | Kozlovsky et al. |
| 5,951,369 | A | 9/1999 | Kordonski et al. |
| 5,971,835 | A | 10/1999 | Kordonski et al. |

(Continued)

OTHER PUBLICATIONS

Basov et al., "Laser Cathode-Ray Tubes Using Multilayer Heterostructures", Laser Physics, vol. 6. No. 3, 1996, pp. 608-611.

(Continued)

Primary Examiner—Ashok Patel
(74) Attorney, Agent, or Firm—Chen Yoshimura LLP

(57) ABSTRACT

An electron beam pumped laser including a surface-emitting laser faceplate oriented at a non-perpendicular angle. Embodiments are described in which a bending coil bends the electron beam, or in which the faceplate is situated in the direct path of the e-beam emission but with a non-zero orientation angle. The faceplate may include a substantially opaque substrate, and an opaque heat-removing structure may be attached to the substrate to provide high heat transfer, thereby allowing high electron-beam pumping intensity and providing more light emission from a smaller package. In some embodiments the partially reflective mirror comprises a metal layer that has a plurality of openings. Multiple laser faceplates (e.g., red, green, and blue) may be placed in the same tube, to provide a continuous light source for projection television. The substrate may be connected to ground to provide an exit path for electrons from the laser gain layer.

2 Claims, 8 Drawing Sheets

U.S. PATENT DOCUMENTS

| | | |
|---|---|---|
| 6,016,028 A | 1/2000 | Iguchi et al. |
| 6,331,749 B1 | 12/2001 | Makienko et al. |
| 6,373,179 B1 | 4/2002 | Makienko et al. |
| 6,556,602 B2 | 4/2003 | Rice et al. |
| 2002/0021063 A1 | 2/2002 | Makienko et al. |
| 2002/0057384 A1 | 5/2002 | Makienko et al. |
| 2002/0126262 A1* | 9/2002 | Sherman et al. ............... 353/31 |
| 2005/0024717 A1 | 2/2005 | DiJaili et al. |
| 2005/0110386 A1 | 5/2005 | Tiberi et al. |
| 2006/0029112 A1 | 2/2006 | Young et al. |

OTHER PUBLICATIONS

Katsap et al., "CdSxSe1-x/CdS Heterostructures in Longitudinally Electron-Beam-Pumped Lasers", Sov. J. Quantum Electronics, 17(10) pp. 1272-1274 (Oct. 1987).

Kotovshchikov et al., "Sealed Scanned Electron-Beam-Excited Semiconductor Laser", Sov. J. Quantum Electronics, 4(2) pp. 242-243 (Aug. 1974).

Kozlovskii et al., "Characteristics of CdS Laser Screen Radiation at 300 degrees K", Sov. J. Quantum Electronics, 11(11) pp. 1522-1526 (Nov. 1981).

Sadchikhin et al., "Electron-Beam-Pumped Semiconductor Lasers for Projection to Large Screens", ASIA Display 98, pp. 717-719 (circa 1998).

* cited by examiner

ELECTRON BEAM PUMPED LASER LIGHT SOURCE FOR PROJECTION TELEVISION

This is a divisional application of U.S. application Ser. No. 11/041,839, filed Jan. 24, 2005, issued on Dec. 18, 2007 as U.S. Pat. No. 7,309,953, which is herein incorporated by reference in its entirety.

BACKGROUND OF THE INVENTION

1. Field of the Invention

The present invention generally relates to electron beam pumped lasers, and particularly to electron beam pumped lasers such as those that provide a light source for projection television.

2. Description of Related Art

Projection televisions for consumer applications utilize a white light source such as a xenon or halogen lamp, dichroic filters to separate the red, green and blue light components, and a spatial light modulator (SLM) to modulate the red, green, and blue light. The modulated light is then projected through appropriate optics to generate an image. A number of SLM technologies may be used, such as liquid crystal panels, digital micro-mirrors, and grating light valves, for example. Alternative light sources such as LEDs or laser diodes are either impractical or non-existent for consumer projection televisions because they require too much power for consumer use and are too expensive. For example, the large light emitting surfaces of multiple LEDs make it difficult and expensive to optically capture the emitted light and difficult and expensive to modulate it with an SLM.

An alternative light source, now under development, utilizes one or more laser cathode ray tubes ("Laser-CRTs") to generate red, green or blue laser light. The different colors can then be combined, modulated and projected to generate an image.

Prior art Laser-CRTs include a laser faceplate in a conventional cathode ray tube. The laser faceplate comprises a laser medium sandwiched between a highly reflective mirror and a partially reflective mirror in which a scanning electron beam bombards the highly reflective mirror. The partially reflective mirror may include a stack of quarter-wave alternating layers of $Al_2O_3$ and $TiO_2$ for example. An electron gun generates an electron beam, which is deflected and focused by electromagnets to impinge upon a desired location on the laser faceplate.

In prior art laser CRTs, the electron beam emitted from the electron gun travels a longitudinal direction toward the laser faceplate at the opposite end of the tube. The electron beam is deflected along the horizontal and vertical axis as it passes between the deflection coil and the laser faceplate, to impinge upon a desired location on the faceplate. In a fraction of a second, the electron beam is scanned across all the screen pixels, thereby creating a raster scan similar to conventional CRT operation. The electron gun may be modulated as the beam is scanned across the faceplate, thereby creating an image.

SUMMARY OF THE INVENTION

An electron beam pumped vertical cavity surface emitting laser is described herein that has a laser faceplate oriented at a non-perpendicular angle with respect to the direction of the electron beam emitted from the electron gun, and the laser faceplate has a surface-emitting configuration, (i.e., the laser faceplate operates to emit laser radiation in a direction generally back toward the electron beam rather than in the same direction). Because the faceplate is surface-emitting, the faceplate can be opaque rather than transmissive. Embodiments are described in which a bending coil bends the electron beam to impinge upon the faceplate, which is situated out of the direct path of the emission axis. Embodiments are also described in which the faceplate is situated in the direct path of the e-beam emission but with a non-zero orientation angle, and the laser emission exits the tube at an angle.

The laser CRTs comprises a vacuum tube envelope, an electron gun situated at one end of the vacuum tube envelope. The electron gun is arranged to emit an e-beam along an e-beam axis. At least one laser faceplate is arranged approximately at a non-perpendicular orientation angle to the e-beam axis to receive the e-beam. Each laser faceplate comprises a partially reflective mirror arranged to receive the e-beam, a highly reflective mirror arranged parallel to the partially reflective mirror to define an optical cavity, a laser gain layer comprising a semiconductor material arranged between the highly reflective mirror and the partially reflective mirror within the optical cavity, and a substantially opaque heat-removing structure connected to the laser faceplate.

In some embodiments the laser faceplate comprises a bending coil at the opposite end of the vacuum tube, the bending coil arranged to bend the e-beam by a non-zero bending angle from the e-beam axis. For example, the e-beam bending angle may be about 90° and the faceplate orientation angle is about 0°.

Embodiments are disclosed in which the partially reflective mirror comprises a metal layer that has a plurality of openings allowing output of laser light, the metal layer having a thickness small enough to substantially allow transmission of electrons in the e-beam.

Because the faceplate can be opaque, much more effective (e.g., metal) heat sinks can be implemented. Due to the higher heat transfer, electron-beam pumping intensity can be increased significantly, thereby providing more light emission from a smaller package. One related advantage is lower cost: because the laser faceplate can be made much smaller, a greater number of devices can be manufactured from one wafer since only a small area need be scanned to produce the required light output.

Another advantage of the small size is that multiple laser faceplates can now be placed in the same tube, which allows multiple colors to be generated in a single tube. Particularly, the small size allows at least two laser faceplates arranged approximately at a non-perpendicular orientation angle to the e-beam axis to receive the e-beam. In one embodiment the laser-CRT comprises a red laser faceplate, a green laser faceplate, and a blue laser faceplate. This embodiment may include a plurality of intermediate substrates, each of the intermediate substrates connected to one of the faceplates, and the substrates respectively comprise materials thermal-expansion respectively matched to the faceplates to which they are connected, and a primary substrate connected to the plurality of intermediate substrates.

One potential use for the eVSCEL described herein is a visibly continuous light source for projection television, thereby providing an alternative to a conventional lamp source. For example such a laser projection system comprises a laser-CRT that generates a plurality of laser beams of different colors, a projection system optically coupled to receive the laser beams, combine the light, and project the combined beam onto a screen to form an image; and an electron beam current control system connected to the electron gun on each of said laser-CRTS. The current control system may be able to individually control the electron beam current in each faceplate, thereby providing a system to balance color in the projected image.

Because the laser emission does not travel through the faceplate, the bonding materials are not required to be transmissive. Therefore the faceplate described herein eliminates the need for transparent epoxies, which eliminates one major source of contamination. Particularly, elimination of organic compounds such as transparent epoxies inside the vacuum envelope eliminates contaminants that could otherwise shorten the lifetime of the cathode and tube.

One problem with conventional laser faceplates relates to the unwanted build-up of electrons in the valance band of the semiconductor, which is a result of e-beam pumping. If the electron density were to increase too much in the semiconductor, then laser efficiency could be reduced or, at high levels, laser operation would be quenched altogether. The transparent substrates in common use (e.g., sapphire or glass) are poor electrical conductors, and their high resistance presents an obstacle to removal of the excess electrons from the semiconductor. In comparison, substrate embodiments disclosed herein advantageously provide a low resistance path for electrons to flow from the semiconductor, thereby improving laser performance.

Therefore embodiments are disclosed in which the substrate, which is positioned between the highly reflective mirror and the heat-removing structure, is substantially electrically conductive, and the substrate is connected to a reference voltage (e.g., ground) to provide an exit path for electrons to exit from the laser gain layer.

Advantageously, most opaque substrates with high thermal conductivity are also electrically conductive to some extent. Therefore such a substrate can be connected to a suitable ground or other voltage appropriate to the particular design, and then the substrate can effectively provide a path for the electrons that would otherwise increase in number in the semiconductor's valence band due to the electron beam pumping. In summary, because the substrate is not required to be transparent, it can easily be made of an electrically conductive material such as metal that provides a low resistance path to ground. Even a substrate made of GaAs is more electrically conductive than transparent materials such as sapphire or glass. Therefore, using the electrically conductive substrate connected to ground, excess charge would not build up within the semiconductor, thereby improving overall performance and efficiency of the laser.

A method is disclosed of making the laser faceplate that takes advantage of the cost benefits and greater efficiency of the epitaxial growth processes. This method includes growing a highly reflective layer on an substrate (e.g., a DBR), growing a semiconductor gain layer on the highly reflective layer, forming a partially reflective layer on the gain layer, thereby providing an optical cavity between the highly reflective layer and the partially reflective layer; and connecting the substrate to a heat removal system. The step of forming a partially reflective layer may include growing a distributed Bragg reflector on the semiconductor layer. The step of growing the gain layer may include defining a MQW structure in the semiconductor gain layer.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION

This invention is described in the following description with reference to the Figures, in which like numbers represent the same or similar elements.

Glossary of Terms and Acronyms

The following terms and acronyms are used throughout the detailed description:

eVCSEL electron beam-pumped vertical cavity surface emitting laser

Laser-CRT (LCRT) a cathode ray tube with a laser faceplate

CRT cathode ray tube e-beam electron beam emitted from an electron gun in a CRT electron beam spot the area within which the e-beam energy is concentrated on the laser faceplate electron beam the axis of electron beam emission from the electron gun emission axis orientation angle the angle of the faceplate with respect to the electron beam emission axis bending angle the angle through which the e-beam is bent before striking the faceplate CTE Coefficient of Thermal Expansion MQW multiple quantum well low-dimensional MQW two-dimensional strained quantum wells, one-dimensional structure (e.g. quantum lines), and zero-dimensional (e.g. quantum dots) quantum well structures.

DBR distributed Bragg reflector

Description

Figure 1:
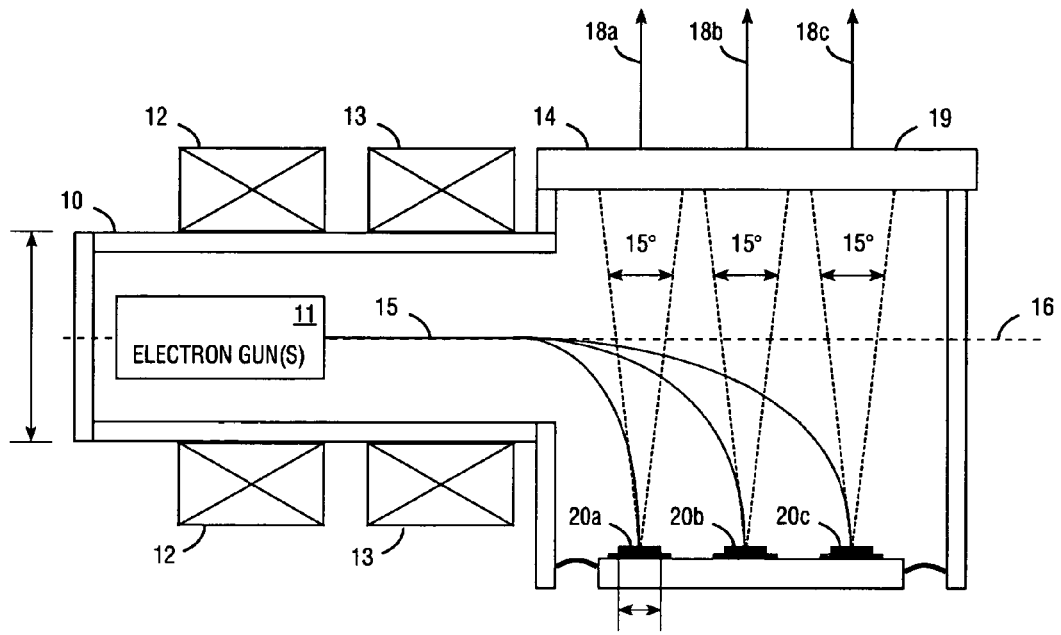
FIG. 1 is a side view of an eVSCEL approximately parallel to the electron beam axis as disclosed herein.
Figure 2:
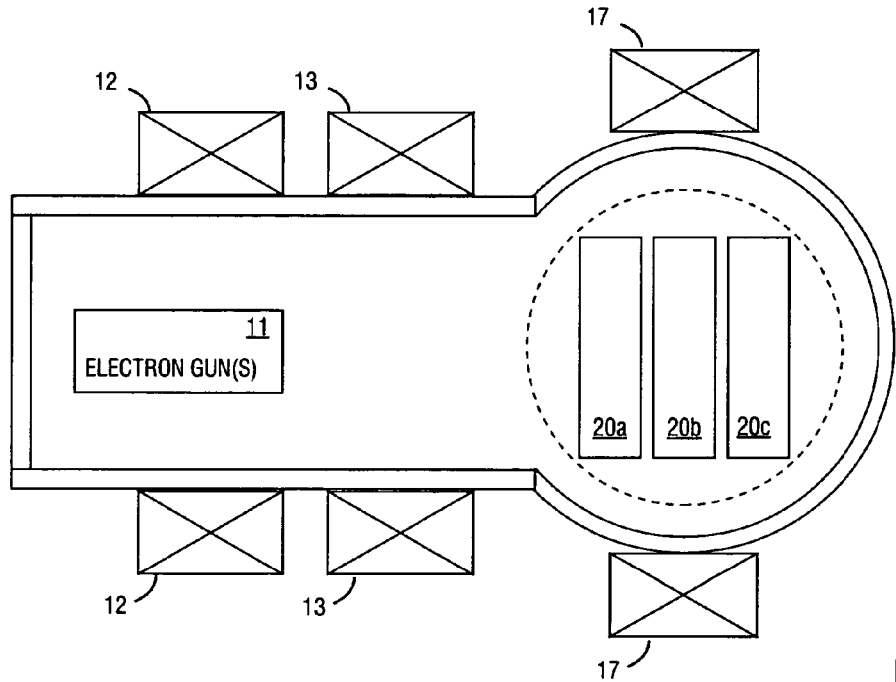
FIG. 2 is a top view of an eVSCEL approximately parallel to the electron beam axis as disclosed herein.

FIG. 1 is a cross-section of an eVCSEL light source tube envelope from the side view, and FIG. 2 is a cross-section of the tube envelope from a top view. As shown in FIGS. 1 and 2, the eVSCEL generally defines two sections. A first tube section 10 comprises a smaller diameter tube (e.g., approximately eleven inches in length and one and one-half inches in diameter.) An electron gun 11 is housed on one end of the smaller tube, and the electron gun 11 is arranged to emit electrons along the tube. In some embodiments, multiple electron guns (e.g., 3) may be included.

A focus coil 12, and a deflection coil 13 are arranged around the first tube section 11; particularly, the smaller diameter tube positions the focus coil 12 and the deflection coil 13 in an appropriate position to control the placement of the electron beam emitted from the electron gun 11. The small tube section 10 is connected on the end opposite the electron gun to a second tube section 14. The second tube section comprises a larger diameter tube. The larger tube section 14 may, for example, be three inches in inner diameter and four inches in height at the outside. The focus coil 12 and the deflection coil 13 can also be internal to the tube envelope using electrostatic focus and deflection.

A plurality of laser faceplates 20 is provided on one side of the larger tube section 14; particularly, a first laser faceplate 20a, a second laser faceplate 20b, and a third laser faceplate 20c are provided in the larger tube section. In the embodiment of FIGS. 1 and 2, the faceplates have an orientation angle of approximately zero with respect to the electron beam emission axis; i.e., they are approximately parallel. In alternative embodiments the orientation angle may be non-zero (i.e., non-parallel). The construction of the laser faceplates is described elsewhere herein in more detail, for example with reference to FIG. 4. As will be described, the laser faceplates include an input/output surface that receives the electron beam and emits laser radiation back toward the direction from which it is pumped. Because the faceplate's substrate is not required to be transmissive to light, a highly heat-conductive material, such as a metal, can be used to remove heat instead of the transparent materials (such as sapphire) used in conventional arrangements. Because a metal's thermal conductivity is higher (e.g., two to five times that of sapphire), more power can be pumped into the laser faceplate, which directly translates to increased light output since heat can be removed more efficiently.

In operation, the electron gun 11 emits an electron beam 15 in a direction along an emission axis 16. After being controlled by the focus coil 12 and the deflection coil 13, the deflected electron beam enters the larger tube section 14. Within the larger tube, an additional electromagnetic or a permanent magnet coil (a bending coil) 17 further deflects the electron beam by a bending angle, causing the electron beam to strike each of the laser faceplates 20a, 20b, and 20c in a direction approximately perpendicular to the top surface of the faceplate. In FIG. 1, the bending angle is shown at approximately 90° and the orientation angle is about 0°; however in other embodiments other arrangements can be implemented. For example one embodiment can implement the bending angle at 80° and the orientation angle at 10°. It should be noted that the particular bending angle provided by the bending coil depends upon the orientation angle of the faceplate; for best efficiency, the bending angle is chosen to bend the electron beam sufficiently to impinge upon the faceplate approximately in an approximately perpendicular direction, and therefore it is advantageous if the total of the bending angle and the orientation angle is approximately 90° (e.g., 10° and 80°, 20° and 70°, 30° and 60°. Furthermore, in addition to its purpose of bending the beam, the bending coil 17 may be designed to correct for geometric and electron beam distortion or can be used for vertical deflection of the electron beam.

Upon hitting the laser faceplate, the electrons in the electron beam 15 travel through the input/output surface (e.g., a thin layer of metal, or dielectric stack), and are absorbed by the gain material within the laser faceplates, pumping the gain medium to generate laser emission. The laser light then emerges as a series of laser beams 18a, 18b, and 18c from the upper surface of the faceplate through a glass window 19. The emerging laser light may then be captured by a series of lenses or optical fibers, or by any other suitable optical system, as appropriate or useful for the intended use. In one embodiment, the half-angle of emission is about 15°; however other embodiments may provide different angles of emission.

Laser Faceplate Description

Figure 3:
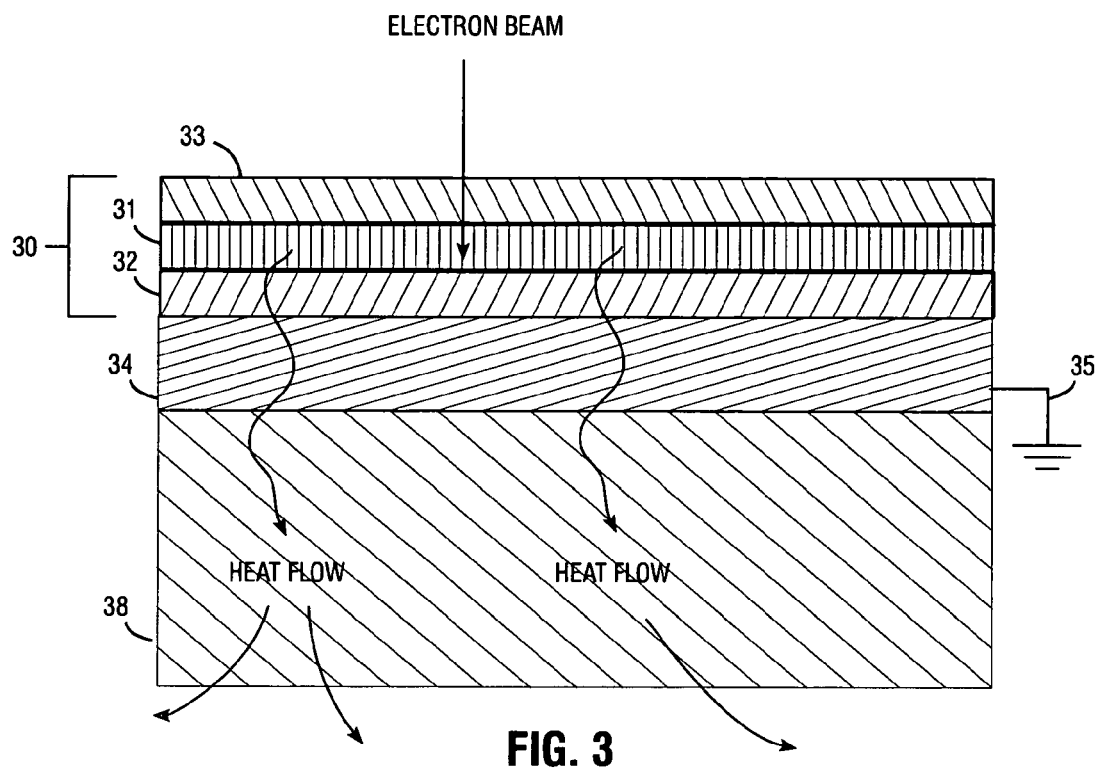
FIG. 3 is a cross-sectional view of a conceptual laser faceplate, illustrating electron beam absorption and resulting heat generation.

FIG. 3 is a cross-sectional view of the structure of a laser faceplate that operates in a surface-emitting (i.e., non-transmissive) mode. The laser faceplate defines a laser cavity 30 that includes a gain layer 31 sandwiched between a highly reflective mirror 32 and a partially reflective mirror 33.

The gain layer 31 can be made, for example, from a bulk semiconductor wafer, a multiple quantum well structure, quantum dots, or quantum wires whose energy band gap is suitable for visible light output. For example single crystal bulk semiconductor wafers of cadmium sulfide (CdS) may be used for green light emission, zinc sulfide selenide (ZnSSe) for blue emission, and cadmium sulfide selenide (CdSSe) for red emission. Alternatively gain layer 31 can also be made from a multiple layer heterostructure or multiple quantum well structure consisting of quantum wells and barriers in a strained structure as in Kozlovsky et al., U.S. Pat. No. 6,687,185, which is incorporated by reference herein. Also, the gain layer can be made using a one-dimensional quantum wire or a zero-dimensional quantum dot, also referred to as low-dimensional structures. Quantum dot lasers have been demonstrated using InAs, InGaAs and InP for infrared laser emission and ZnCdSe, CdSe, or CdS for visible.

The partially reflective mirror 33 is bombarded by the scanning electron beam and is also the output mirror from which the laser light is emitted. Preferably, this mirror is as thin as possible so as to absorb only minimum energy from the impinging electron beam prior to entering the gain layer 32. In one embodiment, the partially reflective mirror 33 comprises a stack of dielectric layers selected to provide the appropriate reflectivity and transmissivity (e.g. 90 to 99% reflectivity and 10 to 1% transmissivity, respectively) in the desired color band. In another embodiment, described in detail with reference to FIGS. 4, 5, and 6, the partially reflective mirror 33 comprises a thin metal layer 42 that has an array of openings 43, in addition to a stack of dielectric layers 41.

The highly reflective mirror 32, which is situated below the gain layer, comprises any suitable reflector, for example several dielectric layers (e.g., $Al_2O_3/TiO_2$) and a thin metal layer (e.g., Ag, Al) to achieve a high level (e.g. 99%) of reflectivity and optionally suppress undesired lasing wavelengths. In FIG. 3, the highly reflective mirror 32 is shown bonded to a heat removing substrate 34 by a connector layer 44, although in some embodiments the connector layer 44 can be omitted and the surface can be contact bonded.

The substrate 34 may be coated with a plating (e.g., nickel) 36 for improved adhesion of the bonded surfaces. The substrate 34 can comprise various metallic alloys such as a nickel-plated tungsten copper alloy or ceramic materials such as AlN, BeO or SiC whose thermal expansion is closely matched to that of the gain layer 31 and have a high thermal conductivity. In addition, glasses in which the thermal expansion coefficient is matched with the semiconductor can also be used for substrate 34.

In FIG. 3, the substrate 34 is connected to ground 35 (or any appropriate voltage reference), which provides a low resistance path for electrons in the semiconductor (such as may be absorbed from the electron beam 15) to exit from the gain layer 31. Because the substrate is not required to be transparent, it can easily be made of an electrically (and thermally) conductive material such as metal that provides a very low resistance path to ground. Even a GaAs substrate is more electrically conductive than transparent materials in common use such as sapphire or glass. By providing an exit path for electrons, the electrically conductive substrate can effectively prevent an unwanted increase in the number of electrons in the semiconductor's valence band, thereby improving overall performance and efficiency of the laser.

The substrate 34 may comprise one layer, or multiple layers of different materials. For example in a configuration such as described with reference to FIGS. 10 and 11 where all three laser faceplates, (e.g., a red, green, and blue faceplate), are inside one tube, different substrates are selected to approximately match the CTE of the semiconductor material. Advantageously, thermal expansion matching can prevent mechanical damage (e.g. cracks, separation of layers) due to thermal-expansion mismatches. In one such example, the three laser cavity faceplates are each placed on a separate intermediate plate (which may be comprised of metal) that is expansion-matched to the semiconductor material. The intermediate plates are then all attached to a single plate that has a CTE that has an average CTE of all three materials. In this way the entire support substrate 34 for the lasers may comprise a composite of different materials.

A cooling system 38 is attached to the substrate for removal of heat generated by the laser. The cooling system comprises any suitable cooling system, active or passive, depending upon the intended use. For example if aggressive heat removal is required and the additional cost is justified, then a liquid cooling system may be used. In other embodiments, air-cooled heat fans may be used. As shown, heat flows from gain layer 31, through the highly reflective mirror 32 (which may be very thin), through the substrate 34, and then into the cooling system 38 from which it is dissipated into the outside environment.

Figure 8:
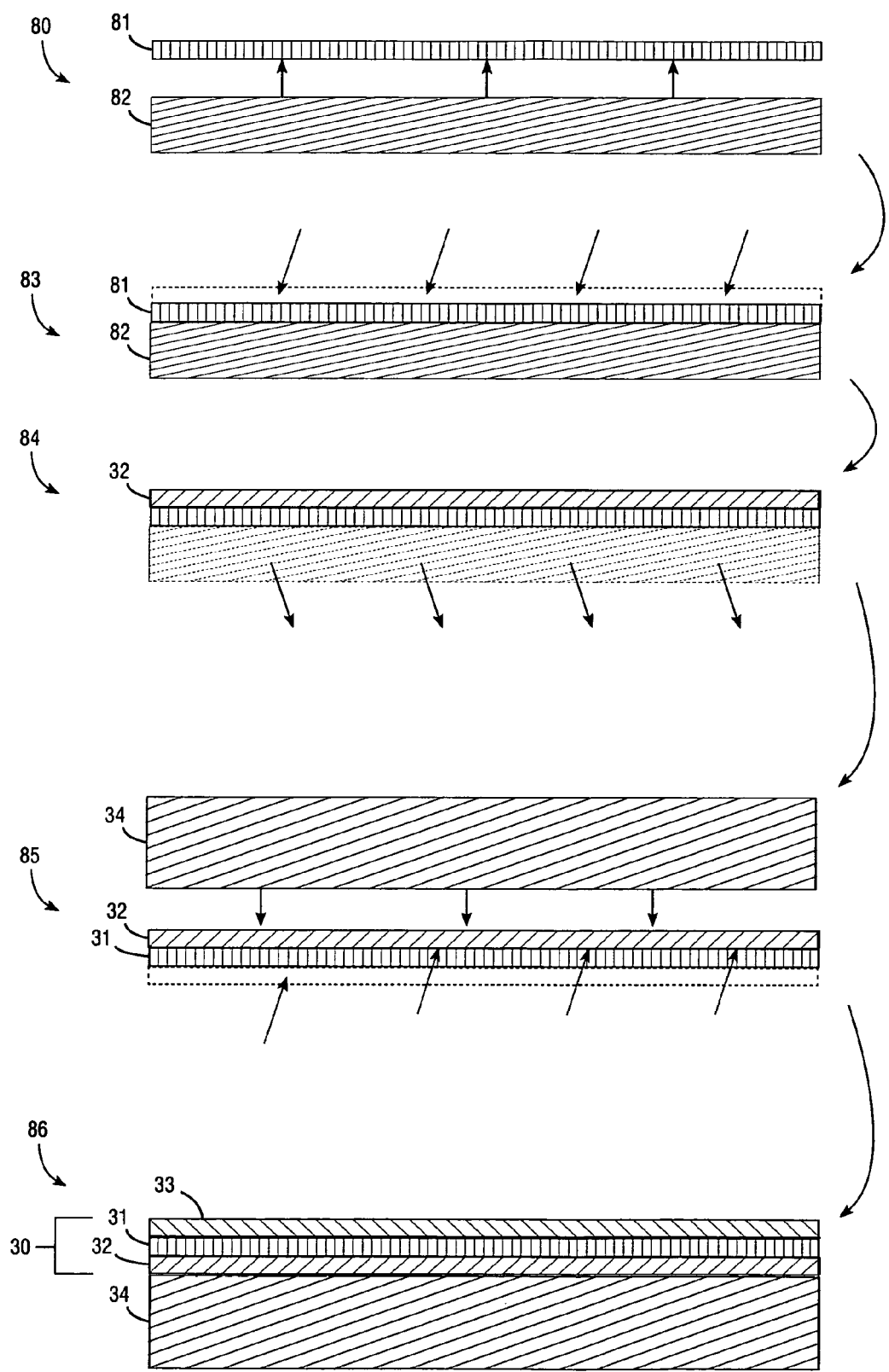
FIG. 8 is a diagram of one embodiment of a faceplate production method.
Figure 9:
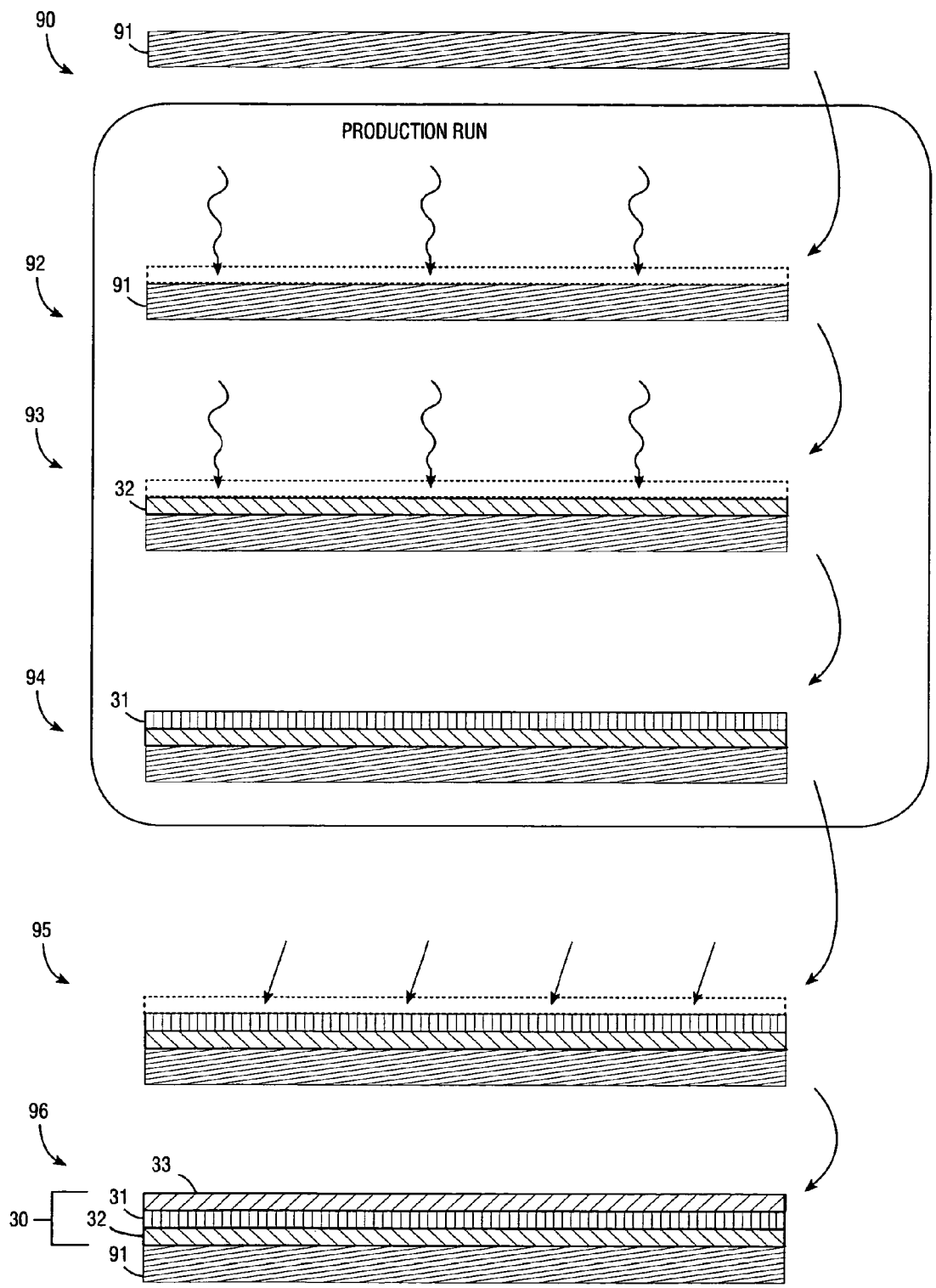
FIG. 9 is a diagram of another embodiment of a faceplate production method.

The faceplate is manufactured in any suitable way, typically some combination of coating and epitaxial growth. Two different methods of manufacture are illustrated in FIGS. 8 and 9 and discussed in more detail with reference thereto. The two methods are distinguished generally by how the highly reflective mirror is formed: 1) optical coating techniques, and 2) growth on a substrate. The first method is straightforward, and can work for a variety of materials. The second method has particular advantages in efficiency and cost, because more of the processing is epitaxial growth, it is not necessary to remove the substrate, and the process can be done efficiently in a single production run in a vacuum chamber.

Example of Faceplate

Figure 4:
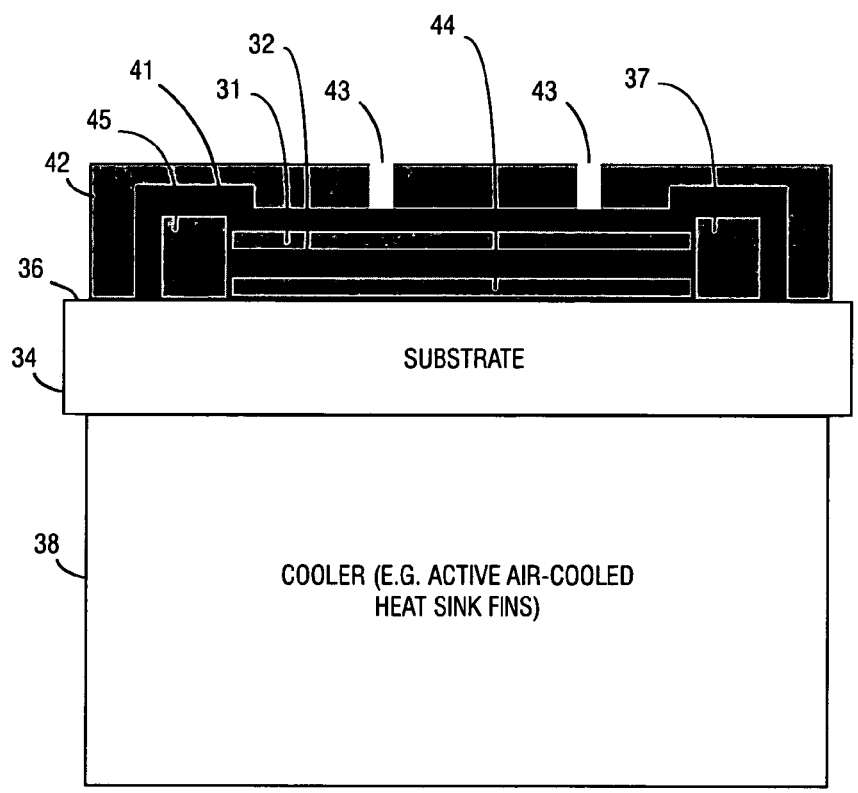
FIG. 4 is a cross-sectional view of an embodiment of a laser faceplate in which the partially reflective mirror includes a metal layer that has openings to allow the laser beam to exit from the laser cavity.

Reference is now made to FIG. 4, which is a cross-sectional view of one embodiment of a laser faceplate. In this embodiment, the partially reflective mirror is defined by a stack of dielectric layers 41 and a metal layer 42 that has a plurality of openings 43 formed therein.

The highly reflective mirror 32 is connected to the substrate 34 using a suitable connector layer 44, such as a metal alloy solder. In some embodiments, a layer 45 of highly conductive metal (e.g., chromium) may be deposited in an annular ring around the outside of the laser structure to assist in providing a conduction path for excess electrons.

Instead of the opaque connector layer 44 described herein, conventional laser CRTs must utilize a transparent connecting layer on the outside of the laser faceplate to transmit the laser light generated in the faceplate. Usually, an organic epoxy is used to connect the laser cavity to a transparent optical window. Unfortunately, in a vacuum envelope organic compounds such as an optically transparent epoxy produce undesirable gases, particularly at high temperatures. Therefore, the presence of these organic compounds within the vacuum envelope would limit the temperature at which the CRT can be processed and furthermore would limit the overall lifetime of the device by contaminating the cathode.

Advantageously, in embodiments described herein there is no need for a conventional transparent bonding layer, and therefore no need to use transparent organic compounds to bond the layers. Because conventional transparent bonding layers outgas contaminants into the vacuum tube, by eliminating the transparency requirement as described herein this source of contamination can be eliminated. In one embodiment the connector layer 44 comprises a metal alloy solder, which for example melts in a temperature range of 175° C. to 350° C. depending upon the composition of the alloy. The laser resonator, defined by the semiconductor region 31 between two parallel mirrors, is connected to the solid metal substrate 34 that is expansion-matched to the semiconductor. Therefore, in this configuration, it is unnecessary to utilize organic materials within the vacuum envelope to bond components together. In some embodiments, thermal-expansion-matched glass coated with a thin layer of chromium and gold can be implemented to provide an adhesion surface for connector layer 44.

In one embodiment the connector layer 44 includes a conductive epoxy that is selected to provide no (or very little) outgassing, thereby avoiding damage to the cathode that would otherwise occur due to organic containments in a conventional transparent epoxy. Some suitable conductive epoxies are manufactured by Epoxy Technology of Billerica, Mass., and several specific products of conductive epoxies applicable are H44, H20S and E4110, which are typically opaque.

Figure 5:
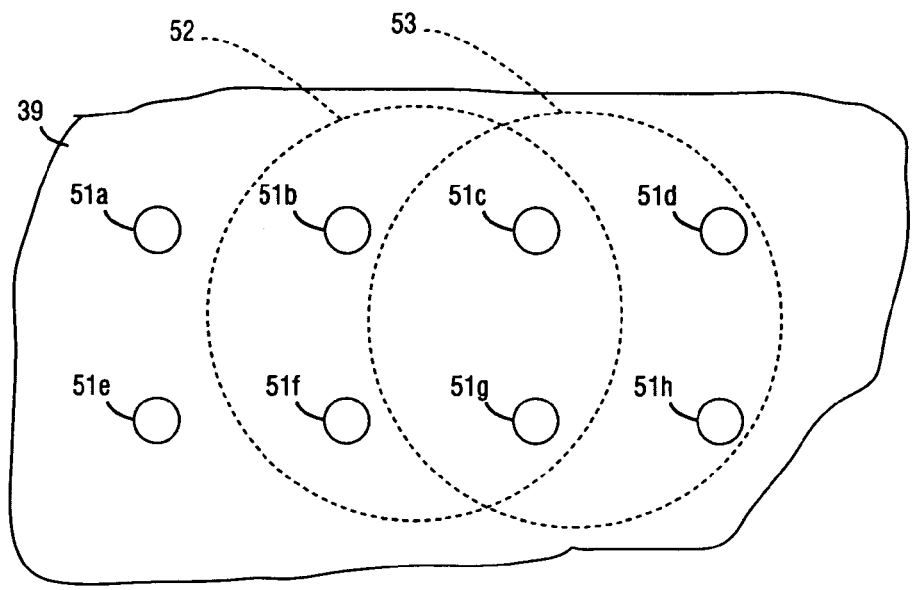
FIG. 5 is a top view of a portion of one embodiment of a laser faceplate in which the partially reflective mirror includes a metal layer that has openings, illustrating the boundaries of an electron beam impinging upon the faceplate, defining an electron beam spot.
Figure 6:
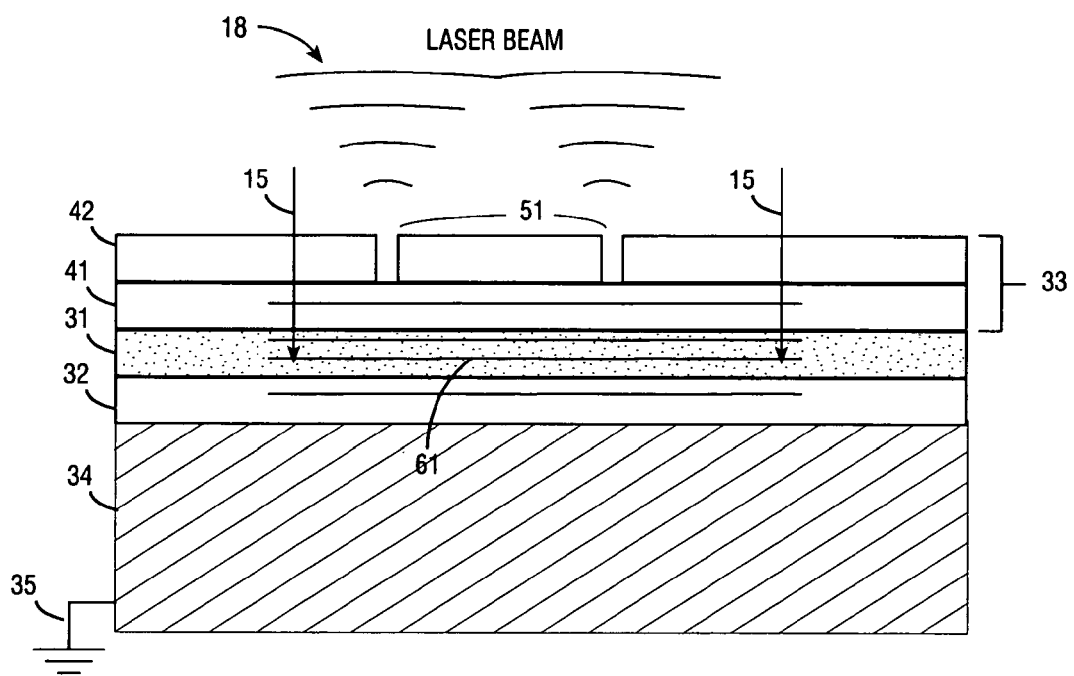
FIG. 6 is a cross-section of the laser resonator portion of the laser faceplate in an embodiment in which the partially reflective mirror includes a metal layer that has openings, showing an electron beam being absorbed in the gain layer, resulting in a laser emission that exits from openings in the partially reflective mirror.

In the embodiment shown in FIGS. 4, 5, and 6, the partially reflective mirror 33 comprises two parts: a stack of dielectric layers 41 and a thin metal layer 42 that has a plurality of openings 43 therein. One advantage of the addition of the metal layer is a significant reduction in the optical specifications for the dielectric stack; for example only a few layers may be necessary or useful, in comparison to the many layer that would be required to design a partial reflector using only a dielectric stack. Particularly, since total reflectivity is provided by the metal layer, the dielectric stack may need only a few layers, such as those needed to provide sufficient wavelength suppression out of the desired band, and those needed to provide additional reflectivity for the area of the openings. However, one disadvantage of the metal layer embodiment is the lower damage threshold of the metal layer vs. the dielectric stack; which could reduce the useful lifetime of metal layer faceplate embodiment.

The thin metal layer 42 comprises, for example a layer of 0.1 to 0.3 microns of a metal such as aluminum or silver deposited on top of the dielectric layers in the partially reflective layer 41. In this embodiment, the metal layer 42 can have an array of openings 43 that have any suitable shape; for example the openings may be approximately round openings with diameter $d_h$ from 0.1 to 100 micron and having a distance between the two nearest openings $S_h$ from 1.25 $d_h$ to 50 $d_h$, or quadrant (approximately four-sided) openings with side size $I_h$ from 0.1 to 100 micron and distance between two nearest quadrant openings $S_h$ from 1.4 $I_h$ to 50 $I_h$. The openings 43 may also be slits with width $I_{sl}$ from 0.1 to 20 microns and distance between the two nearest slits $S_{sl}$ from $2 I_{sl}$ to $1000 I_h$.

FIG. 5 is a top view of a portion of the metal layer 42, showing an array of openings 43, including first, second, third, fourth, fifth, sixth, and seventh circular openings 51a, 51b, 51c, 51d, 51e, 51f, and 51g, respectively. In FIG. 5, the circular openings are laid out in regular array. A first electron beam spot location is shown at 52 in dashed lines. The electron beam spot size is large enough to include four openings within its boundaries; in this example the circular openings 51b, 51c, 51f, and 51g all fall within the electron beam spot. It may also be noticed that wherever the spot may happen to fall, several openings fall within its boundaries; for example a second electron beam spot location 53, which has been shifted from the location of first electron beam location, also encompasses four openings.

There are two useful characteristics of a regular array of openings. A first characteristic is that the total area of the openings per electron beam spot should be such as to ensure the intended reflectivity and transparency of the output mirror. A second characteristic is that several openings should be placed within the electron beam spot area to maintain the laser beam divergence determined by the electron beam spot size rather than size of the opening (as shown in FIG. 6).

Laser Operation in Embodiments Having Metal Layer with Openings

FIG. 6 is a cross-section of a portion of the embodiment of the laser faceplate with the metal layer that, together with a dielectric stack, forms the partially reflective mirror which functions as one side of a laser cavity. The laser faceplate includes the thin metal layer 42, the dielectric stack 41, the gain layer 31, and the highly reflective mirror 32. FIG. 6 illustrates an electron beam 15 going through the metal layer 42 and the dielectric stack, and being absorbed in the gain layer 31. The resulting laser emission, shown at 61 as a series of parallel lines, bounces within the laser cavity between the highly reflective mirror, the partially reflective layer, and the thin metal layer, and exits through the openings 43 as a laser beam 18. As mentioned above, multiple openings are situated within the electron beam spot area, which causes the output laser beam to advantageously maintain the laser beam divergence determined by the electron beam spot size rather than size of the individual openings.

In another embodiment the partially reflective mirror 33 can be made without a metal mirror consisting of only a dielectric stack of alternating high and low refractive index materials such as $TiO_2$ and $SiO_2$. Since the electron beam is not going through a metal mirror that damages more easily, it is believed that its useful lifetime of the dielectric stack partial reflector will be much longer.

In FIG. 6, as in FIG. 3, the substrate 34 is connected to ground 35 (or any appropriate voltage reference), which provides a low resistance path for electrons in the semiconductor (such as may be absorbed from the electron beam 15) to exit from the gain layer 31. By providing an exit path for electrons, the electrically conductive substrate can effectively prevent an unwanted increase in the number of electrons in the semiconductor's valence band, thereby improving overall performance and efficiency of the laser.

Variations on eVCSEL Construction

It will be appreciated by those skilled in the art, in view of these teachings, that alternative embodiments may be implemented without deviating from the spirit or scope of the invention. For example, any suitable laser gain layer, and any suitable heat removing substrate, and any suitable vacuum tube structure and electron gun may be implemented.

Bending Angle Variations

As described herein, arranging the faceplate approximately parallel to, or at a substantial nonzero (e.g., >20°) angle to the emission axis of the electron beam allows the faceplate to operate to emit laser radiation back toward the electron beam rather than away from the electron beam, and therefore the electron beam operates reflectively. One advantage of this reflective arrangement is the possibility to use a substrate material, such as a metal, that has a much higher thermal conductivity than the transparent materials (such as sapphire) used in conventional arrangements.

In the embodiments previously described with reference to FIGS. 1 and 2, the electron beam is bent approximately perpendicular (90°) to its emission direction. In other embodiments such as to be described with reference to FIG. 7, a smaller nonzero angle may be used, as appropriate given the design considerations.

Figure 7:
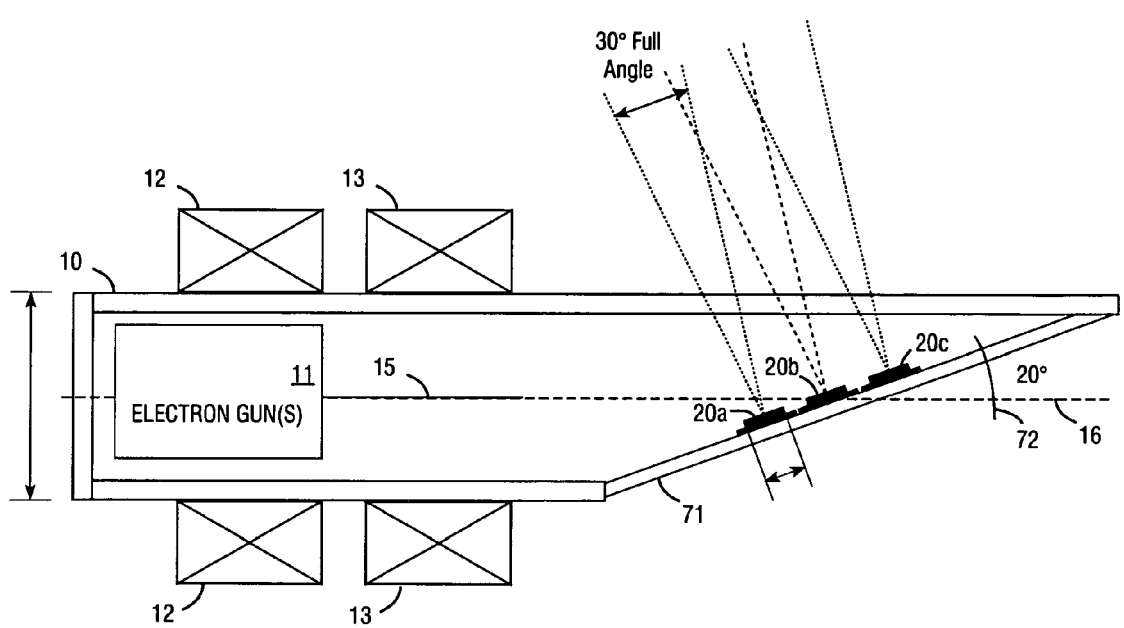
FIG. 7 is a side view of an eVCSEL in which the faceplate is in the direct path of the electron beam, and the faceplate has an orientation angle of about 20° with respect to the electron beam emission axis.

FIG. 7 is a side cross-sectional view of an L-CRT in which the faceplate is oriented at a non-zero, non-perpendicular orientation angle with respect to the electron beam axis. Particularly, in this embodiment, the faceplates are arranged along the emission axis of the electron beam, with an orientation angle of approximately 20°, and therefore the electron beam interacts with each faceplate, but does not need to be bent by 90° as in the embodiment of FIG. 1. One disadvantage of this arrangement is that when angling the e-beam onto the surface of the faceplate instead of directly, a significant portion of the electron beam's energy (e.g. 50% for an angle of 45°) can be reflected rather than absorbed, thereby decreasing the excitation level of the laser cavity. Less excitation level of the laser cavity means less light and lower efficiency. However, for some embodiments the advantages provided by the elimination of the bending requirement, (such as lower cost and smaller profile) may outweigh the disadvantages of less light and lower efficiency. It is believed that reasonably efficient operation can be obtained with orientation angles from 20° and up. Therefore a range of orientation angles would be from about 20° to less than 90°. The upper limit on the orientation angle would be determined by the extent to which the output beam can still exit from the LCRT.

In conventional L-CRTs, one gain layer requires the entire two-inch diameter semiconductor wafer to make one device for a single color for use in television projection because the wafer is also used for image generation. In comparison, in the L-CRT described herein, a much smaller active area (e.g. 10 mm×10 mm) can produce a large amount of light, and therefore a single wafer can be diced into many devices per wafer and is only constrained by heat dissipation since an image will not be produced and only the emitting light is necessary for illumination of an SLM. For example, depending upon size requirements, dozens of devices may be made from a single wafer. Because many devices can be formed from a single wafer, the cost per wafer is significantly reduced.

Examples of Methods of Making Faceplates

The faceplate is manufactured in any suitable way, typically using some combination of coating and epitaxial growth steps.

Reference is now made to FIGS. 8 and 9. Two different methods of manufacture are illustrated in FIGS. 8 and 9, and discussed in more detail with reference thereto. These two methods are distinguished generally by the way in which the highly reflective mirror is formed: 1) optical coating techniques, and 2) growth on a substrate. The first method can be used with a wide range of materials, but has disadvantages in additional cost and process steps. The second method has particular advantages in efficiency and cost, because more of the processing is epitaxial growth, and much can be done efficiently in a single production run in a vacuum chamber.

In FIG. 8, a first step 80 begins by attaching a semiconductor wafer 81 to a substrate 82 by any suitable means, such as by an adhesive. The outer surface of the semiconductor is then processed to a highly smooth surface.

At a next step 83, the highly reflective mirror is formed on the smooth surface of the semiconductor, such as by forming a stack of dielectric layers using any suitable process such as ion beam sputtering.

At the next step 84, the highly reflective mirror 32 has been formed. The substrate 82 is now removed by any suitable process, such as chemical etching.

Then at the next step 85, the gain layer 31, and the highly reflective mirror are attached to the substrate 34. The exposed surface of the semiconductor is processed to form the partially reflective mirror.

Finally at the next step 86, the completed laser structure 30 is shown, including the partially reflective mirror 33, the gain layer 31, and the highly reflective mirror.

In one example, the first surface of a ZnSe semiconductor, gain layer 31, was prepared by diamond fly-cutting to remove surface and subsurface damage from the original cutting of the wafer from the grown boule of material. Two hundred microns of the surface were removed by gradually decreasing the amount of material removed by each pass to minimize subsurface damage from the cutting process. To form the highly reflective mirror, the semiconductor was coated with a highly reflective surface comprising layers of $Al_2O_3$ and $TiO_2$ and then coated with a final layer of silver by electron beam evaporation. A conductive epoxy of about 10 to 15 microns in thickness was then spin-coated on the mirror to form a protective layer for subsequent processing. The semiconductor was then attached to a metal plate with matching thermal expansion coefficient by a conductive epoxy with glass spheres of about 25 microns in diameter in order to ensure a uniform and predictable bond line. The opposite side of the semiconductor was then fly cut to a final thickness of about 15 microns and coated with a partially reflective dielectric mirror consisting of alternating layers of $Al_2O_3$ and $TiO_2$. The finished laser cavity was then attached to a standard cathode ray tube and completed.

Alternatively to the conductive epoxy, a 50-micron sheet of a solder alloy of Sn9 6%/Ag 4% of approximately 50 mm in diameter could be placed between the metal plate and the coated semiconductor. A weight of about two pounds could then be placed on top of the semiconductor, and then the weight and semiconductor heated in a vacuum oven at 275° C. for about 30 minutes to complete the bond.

FIG. 9 is a process diagram of an alternative method for making a faceplate, including a production run in a vacuum chamber. By growing the structure on the substrate, it is not necessary to remove the substrate as one of the process steps, thereby significantly reducing cost and time, and possibly improving yield.

The method begins with a substrate 91 that is suitable for growth processes, such as GaAs. The substrate is prepared in an appropriate manner, such as by polishing the side upon which the deposition will be done.

At step. 92, the highly reflective layer is grown on the substrate. This layer may, for example comprise a distributed Bragg reflector (DBR) as high reflective mirror.

At step 93, the gain layer is grown on the completed highly reflective layer 31.

At step 94, the gain layer 32 is complete and the piece can be removed from the vacuum chamber.

At step 95, the partially reflective layer is formed on the gain layer. This process may for example comprise depositing a stack of dielectric layers, and in some embodiments it could also comprise forming a thin metal layer with openings such as described elsewhere herein. Alternatively, the partially reflective layer may be formed within the production run in the vacuum chamber. For example, the partially reflective layer may be grown as a DBR on top of the gain layer 31.

Finally, at step 96, the process is complete. The laser structure 30 has been grown on the substrate. This structure can now be connected to one or more additional substrates and/or to a cooling system.

Thus a system has been described in which an "as-grown" structure can be used as a whole unit without removing growth substrate completely. As an example a GaInP/AlGaInP gain layer can be grown on an AlGaAs/AlAs DBR, which is grown on a GaAs substrate, to produce a red laser faceplate. For a blue laser faceplate, a GaInN/AlGaN gain layer can be grown on an AlN/GaN DBR on an AlN substrate, or a ZnSe/ZnMgSSe gain layer can be grown on ZnSSe/ZnMgSSe DBR which is grown on a GaAs substrate. To produce a green laser faceplate, a ZnCdSe/ZnSSe gain layer can be grown on ZnSSe/ZnMgSSe DBR, which is grown on a GaAs substrate. Advantageously, if the substrate is GaAs that has a thickness of 100 microns, then problems with nonuniform stress in the glue layer will be reduced.

Multi-color laser-CRT Embodiments

In a simple embodiment the laser faceplate can be a single gain layer covering the surface of the substrate 34, which is bombarded by a single electron beam to generate single color operation; however, in other embodiments any number of additional colors may be added. One particularly useful embodiment is the multi-color faceplate configuration such as shown in FIGS. 1 and 2, including three separate resonators: a red resonator, a green resonator, and a blue resonator. The three-color laser faceplates may be scanned by any suitable scanning system, for example, the three-color laser faceplates may be scanned by a single electron beam for a color sequential operation; alternatively, it may be useful to utilize three electron guns, thereby generating three electron beams that simultaneously bombard each color.

FIGS. 1 and 2 show a configuration in which three laser faceplates, (e.g., a red, green, and blue laser faceplate), are inside one tube. More generally, two or more laser faceplates can be implemented within a single laser-CRT, which then emits light of at least two different colors. In order to remove heat from the faceplates in one embodiment, multiple laser faceplates can be attached to a single substrate. An alternative, particularly effective heat removal structure is described with reference to FIGS. 10 and 11.

Figure 10:
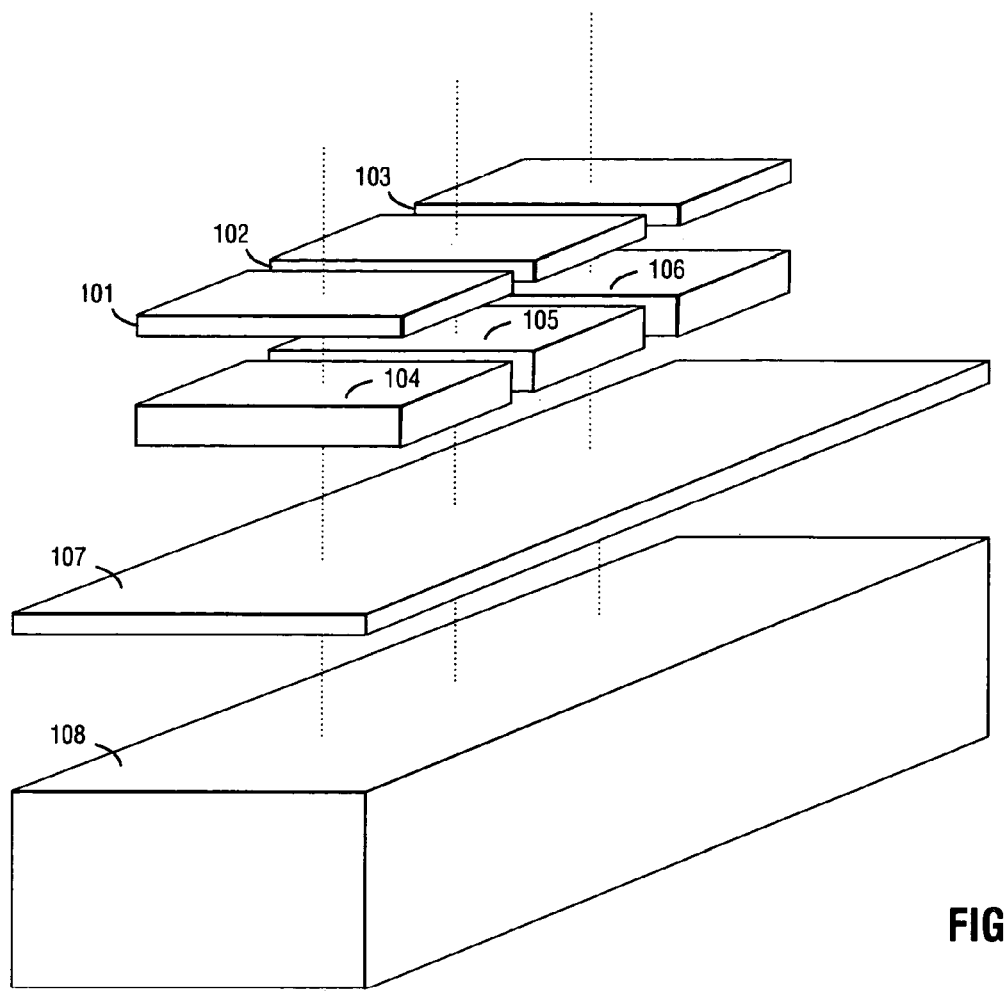
FIG. 10 is an exploded perspective view of one embodiment of a heat removal structure for multiple faceplates.
Figure 11:
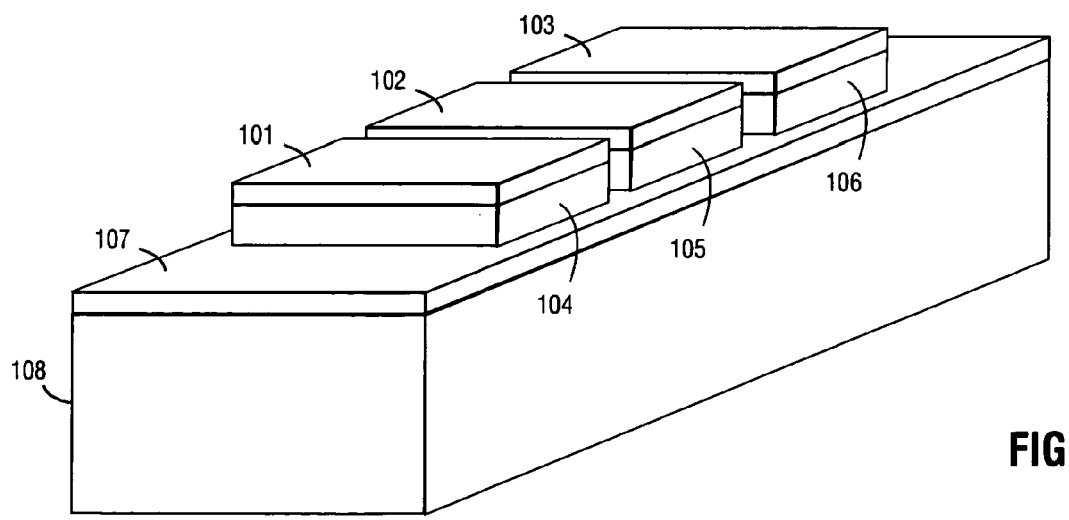
FIG. 11 is an assembled perspective view of the embodiment of a heat removal structure for multiple faceplates shown in FIG. 10.

FIGS. 10 and 11 are perspectives views of one embodiment of a heat removal structure that can accommodate multiple faceplates. Three faceplates are shown, including a first laser faceplate 101 (e.g., red), a second laser faceplate 102 (e.g., green), and a third laser faceplate 103 (e.g., blue). Each faceplate comprises a partially reflective mirror, a highly reflective mirror arranged parallel to the partially reflective mirror to define an optical cavity, and a laser gain layer comprising a semiconductor material situated within the optical cavity.

Each faceplate may comprise different materials, which is apparent because each faceplate emits a different color. These materials may vary in thermal expansion (e.g., their coefficients of thermal expansion (CTE) may be different) sufficiently that a single substrate that is approximately thermal expansion matched to the faceplates may not effectively be able to accommodate the expansion of each of the substrates, even if the average is used.

In FIGS. 10 and 11, the heat-removing structure comprises a plurality of intermediate substrates respectively connected to the faceplates, including a first intermediate substrate 104 connected to the first faceplate 101, a second intermediate substrate 105 connected to the second faceplate 105, and a third intermediate substrate 106 connected to the third faceplate 106. Each of the substrates respectively comprise a material that is substantially thermal-expansion respectively matched to the faceplates to which they are connected.

The intermediate substrates are connected to a primary substrate 107, which is connected to a suitable cooling system 108 such as the cooling system 38 shown in FIG. 3. The cooling system may comprise air-cooled heat fans, or any other cooling system, passive or active. The intermediate substrates, the primary substrate, and/or the cooling system may be opaque to the color of the laser beams emitted from the faceplates.

For example, a green laser faceplate may be made of CdS which has a CTE of $4.6 \times 10^{-6}$/K, a blue laser faceplate may be made of ZnSSe which has a CTE of $7.0 \times 10^{-6}$/K and a red laser faceplate may comprise a MQW laser using GaAs as a growth substrate has a CTE of $6 \times 10^{-6}$/K. In summary each laser is mounted on a CTE-matched metallic plate, which then is mounted on a larger metal or glass substrate 34. In this way the entire support substrate 34 for the lasers may comprise a composite of different materials.

Example of Projection System Using Three-Color Light Engine

Figure 12:
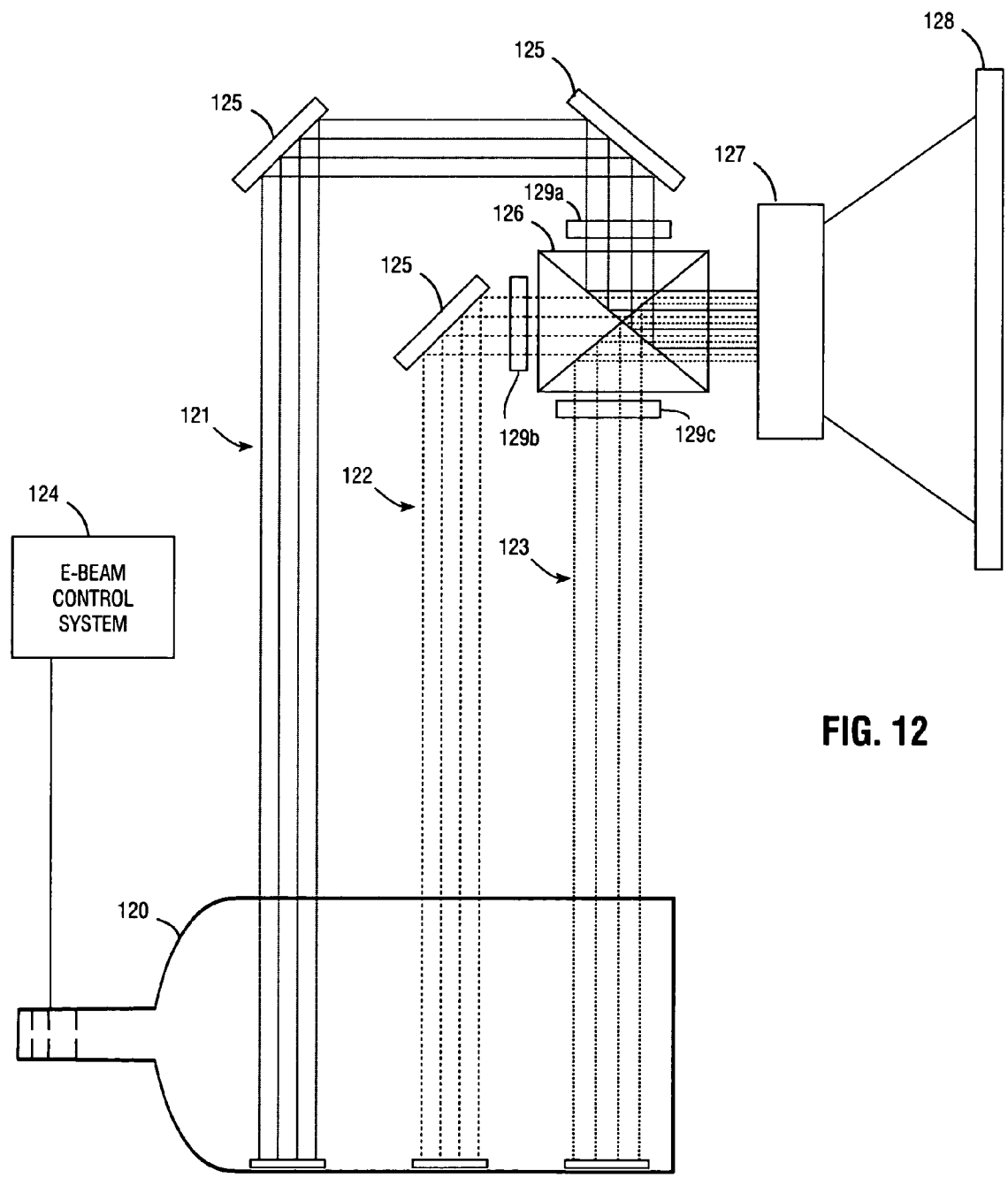
FIG. 12 is a schematic diagram of one example of a projection system that utilizes a laser-CRT as a light source.

FIG. 12 is a schematic diagram of one example of a projection system that uses a single three-color laser-CRT (i.e., a three-color light engine) such as described herein. FIG. 12 shows a laser-CRT 120 that, as in FIG. 1, generates a first laser beam 121, a second laser beam 122, and a third laser beam 123, either at a constant intensity, or modulated, subject to control by an e-beam current control system 124. The modulated laser beams are directed by a suitable optical system such as mirror 125 and then combined in a suitable beam combiner 126 such as an x-prism. The combined beam is then projected by suitable projection optics 127 onto a screen 128.

One example of such a real-world system is a projection system in which each of the three laser beams provide an image: a red image, a green image and a blue image, that are combined and then projected onto a screen to provide a full-color image.

In order to properly balance the color combination to provide a desired color balance, the electron beam impinging upon each of the laser faceplates can be individually adjusted via the control system 124. This adjustment could be accomplished for example manually by a user who individually manipulates the controls for each laser-CRT, or automatically by using sensors as feedback into the current control system that then controls the individual CRTs to provide the desired color balance.

Modulation

In an alternative embodiment the projection system may be implemented using a spatial light modulators (SLM) 129a, 129b, and 129c situated respectively in each beam path. Each SLM operates by individually modulating the pixels defined by the SLM. The SLM may be of any suitable type; for example it may be a transmissive SLM such as a liquid crystal panel, or it may be a reflective SLM such as a grating light valve (GLV) or a digital micro-mirror device (DMD). For purposes of illustration, FIG. 12 shows the transmissive type of SLMs; it should be clear that the principle of SLM modulation applies to all types of SLMs.

A suitable SLM control circuit (not shown) is connected to each SLM. Each pixel of the SLM is individually modulated responsive to image data, and therefore the laser-CRTs are used primarily as an illumination source. Accordingly, the e-beam control system 124 in that embodiment would control the laser-CRTs to provide an apparently constant light source to each pixel. For this purpose, the laser-CRT may illuminate the SLMs in synchronization with the modulation of each pixel.

In some alternative embodiments the SLMs are eliminated and the modulation is performed by controlling the electron beam(s) in the laser-CRT to produce the desired image. For example, in such embodiments the red laser beam is modulated with red image data, the green laser beam is modulated with green image data, and so forth in such a manner to create the desired image.

For at least these above stated reasons, a laser-CRT-based projection system described herein can become available to consumers, for example, for use in grating light valve projectors and other projection display devices. The laser-CRT may also be utilized for other applications, such as optical switches, optical routers, and medical lasers.

This invention is to be limited only by the following claims, which include all such embodiments and modifications when viewed in conjunction with the above specification and accompanying drawings.

What is claimed is:

1. A laser projection system comprising:
    a laser-CRT that emits red, green, and blue laser beams, wherein the laser-CRT comprises:
        a vacuum tube envelope;
        an electron gun situated at one end of the vacuum tube envelope, said electron gun arranged to emit an e-beam along an e-beam axis;
        a plurality of laser faceplates including a red laser faceplate, a green laser faceplate, and a blue laser faceplate arranged approximately at a non-perpendicular orientation angle to the e-beam axis to receive the e-beam, each faceplate comprising:
            a partially reflective mirror arranged to receive said e-beam,
            a highly reflective minor arranged parallel to said partially reflective minor to define an optical cavity, and
            a laser gain layer comprising a semiconductor material situated within said optical cavity; and
        a substantially opaque heat-removing structure connected to said laser faceplates;
    a projection system optically coupled to receive the laser beams, combine the light, and project the combined beam onto a screen to form an image; and
    an electron beam current control system connected to the electron gun of said laser-CRT to individually control the electron beam current in each faceplate, thereby providing a system to balance color in the projected image.

2. The laser projection system of claim 1 wherein said projection system further comprises:
    projection optics; and
    a beam combiner optically coupled to receive the output from said laser-CRTs and provide it to said projection optics.

* * * * *